United States Patent [19]

Dauge

[11] Patent Number: 5,565,781
[45] Date of Patent: Oct. 15, 1996

[54] DEVICE FOR DETECTING THE MALFUNCTIONING OF A LOAD SUCH AS A MAGNETRON

[76] Inventor: Gilbert Dauge, 15, quai du Pre-Long, F-77400 Lagny-sur-Marne, France

[21] Appl. No.: 178,250

[22] PCT Filed: Jul. 8, 1992

[86] PCT No.: PCT/FR92/00655

§ 371 Date: Jan. 10, 1994

§ 102(e) Date: Jan. 10, 1994

[87] PCT Pub. No.: WO93/01654

PCT Pub. Date: Jan. 21, 1993

[30] Foreign Application Priority Data

Jul. 9, 1991 [FR] France .................. 91 08576

[51] Int. Cl.⁶ .............. G01R 31/00; H05B 6/68
[52] U.S. Cl. .......... 324/403; 324/771; 324/102; 363/98; 219/716
[58] Field of Search ................... 324/403, 414, 324/123 R, 102, 103 P; 363/98; 340/662; 327/50, 58, 77, 78; 315/307, 308, 39.51; 331/90; 219/761

[56] References Cited

U.S. PATENT DOCUMENTS

| | | | |
|---|---|---|---|
| 2,147,918 | 2/1939 | Overbeck | 324/771 |
| 2,632,794 | 3/1953 | Alexander | 324/771 |
| 2,875,403 | 2/1959 | Gilbert | 324/771 |
| 2,985,820 | 5/1961 | Schouweiler | 331/90 |
| 3,763,399 | 10/1973 | Jenkins | 324/102 |
| 4,012,617 | 3/1977 | Burke et al. | 219/10.55 B |
| 4,281,372 | 7/1981 | Kornrumpf | 363/20 |
| 4,556,842 | 12/1985 | Rosswurm | 324/102 |
| 4,659,997 | 4/1987 | Ferland | 324/123 R |
| 4,694,402 | 9/1987 | McEachern | 324/102 |
| 4,742,442 | 5/1988 | Nilssen | 363/98 |
| 4,825,028 | 4/1989 | Smith | 219/10.55 B |
| 4,928,059 | 5/1990 | Franklin | 324/123 R |
| 4,933,830 | 6/1990 | Sato et al. | |
| 4,939,331 | 7/1990 | Berggren | 219/10.55 B |
| 5,214,319 | 5/1993 | Abdi | 327/50 |
| 5,216,697 | 6/1993 | Ohnuki | 327/50 |

FOREIGN PATENT DOCUMENTS 0289032 11/1988 European Pat. Off. .

*Primary Examiner*—Maura K. Regan
*Attorney, Agent, or Firm*—Young & Thompson

[57] ABSTRACT

A device for detecting the malfunctioning of a magnetron which operates at start-up with a high power setting $P_0$, and which is connected to the terminals (21, 22) of the secondary winding (19) of a high-voltage transformer (8). This device includes a device for measuring (28) the peak voltage value sampled in the supply circuit, a device for storing (29) the voltage value measured at successive instants, a device for comparing (30) two successive voltage values giving, in the event of a difference in value, an excess signal (a–b), and a device for detecting (31) the excess signal suitable for sending a malfunction signal to a counting device in order to determine the frequency of the malfunction.

6 Claims, 3 Drawing Sheets

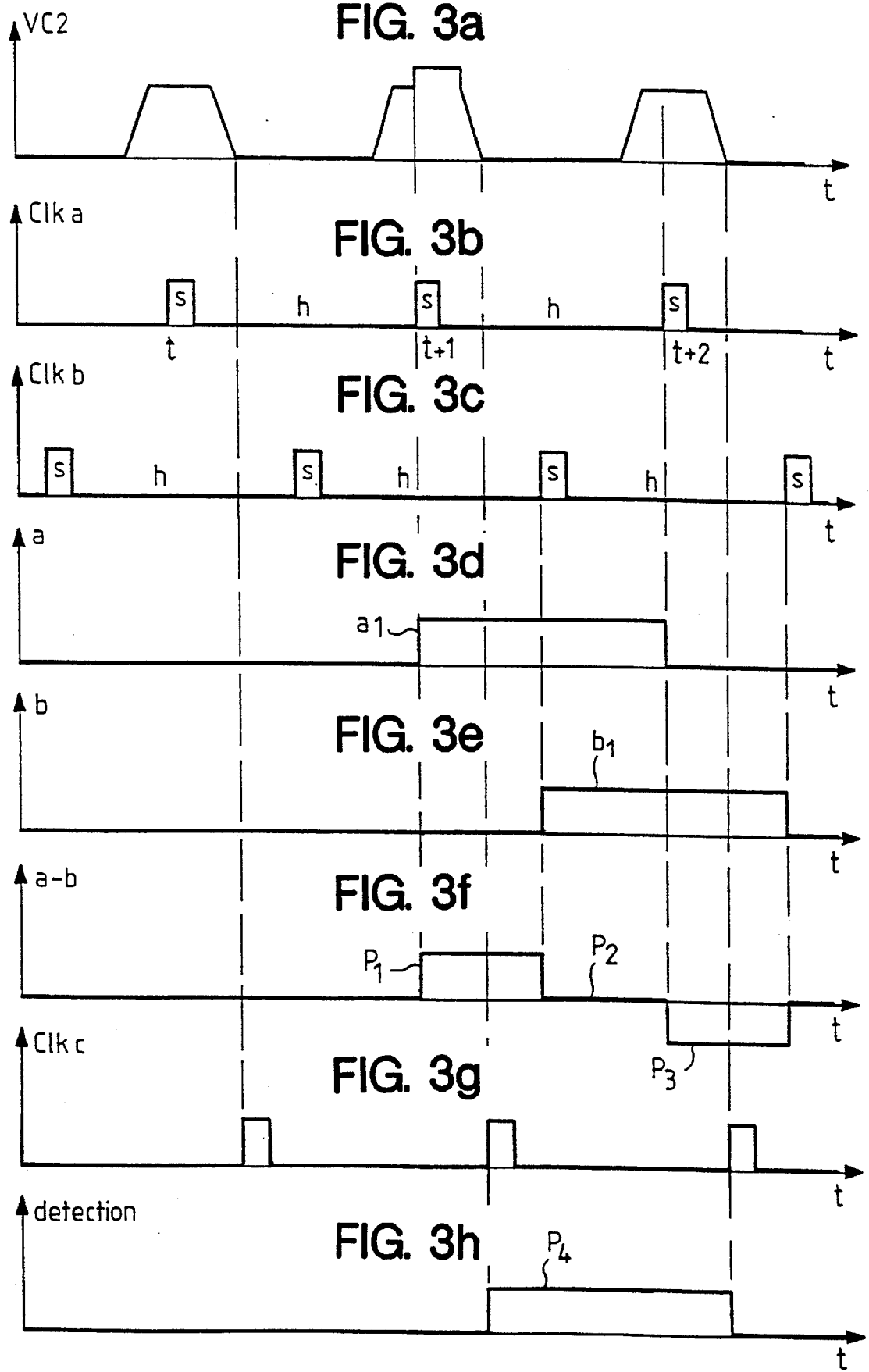

1

DEVICE FOR DETECTING THE MALFUNCTIONING OF A LOAD SUCH AS A MAGNETRON

BACKGROUND OF THE INVENTION

1. Field of the Invention

The invention concerns the control of a unidirectional current load placed in a DC or rectified voltage supply circuit such as, for example, a magnetron, and more particularly a device for detecting the malfunctioning of the load.

2. Description of the Related Art

A unidirectional current load such as, for example, a magnetron operating at start-up with a high power setting, connected to the secondary winding terminals of a high-voltage transformer of a power supply, is sometimes subject, during operation, to voltage fluctuations due to variations of power and temperature. The fluctuations cause undesirable variations of the output power which generally bring about overheating of the magnetron. Consequently, repetition of the voltage fluctuations would bring about deterioration of the magnetron.

The aim of the invention is to remedy this drawback by mounting, on the power supply of the unidirectional load, a device enabling the operation of the unidirectional load to be monitored to avoid voltage fluctuations from recurring too often.

SUMMARY OF THE INVENTION

According to the invention, the device for detecting the malfunctioning of a unidirectional load comprises:

- a means of measuring the peak voltage value at the secondary-winding terminals of the high-voltage transformer;
- a means of storing the voltage value measured at successive moments;
- a means of comparison between two successive voltage values providing, in the event of a difference in value, an excess signal, and;
- a means of sensing the excess signal in order to calculate the frequency at which the malfunctioning of the load appears.

By using the device according to the invention, the voltage fluctuations are measured, stored and analyzed in order to monitor the operation of the unidirectional load such as a magnetron. In this way, regular overheating of the unidirectional load is limited, or indeed even eliminated, which prolongs the life of the magnetron and protects the electrical and electronic components against overvoltages. Moreover, it is not necessary to put costly safeguards into the supply circuit, enabling a saving to be achieved.

BRIEF DESCRIPTION OF THE DRAWINGS

The characteristics and advantages of the invention will appear in the description which follows by way of a non-limitative example, with reference to the accompanying drawings in which:

FIGS. 3a–3h show voltage and clock signal waveforms used to explain the operation of the device according to the invention.

DESCRIPTION OF THE PREFERRED EMBODIMENTS

Figure 1:
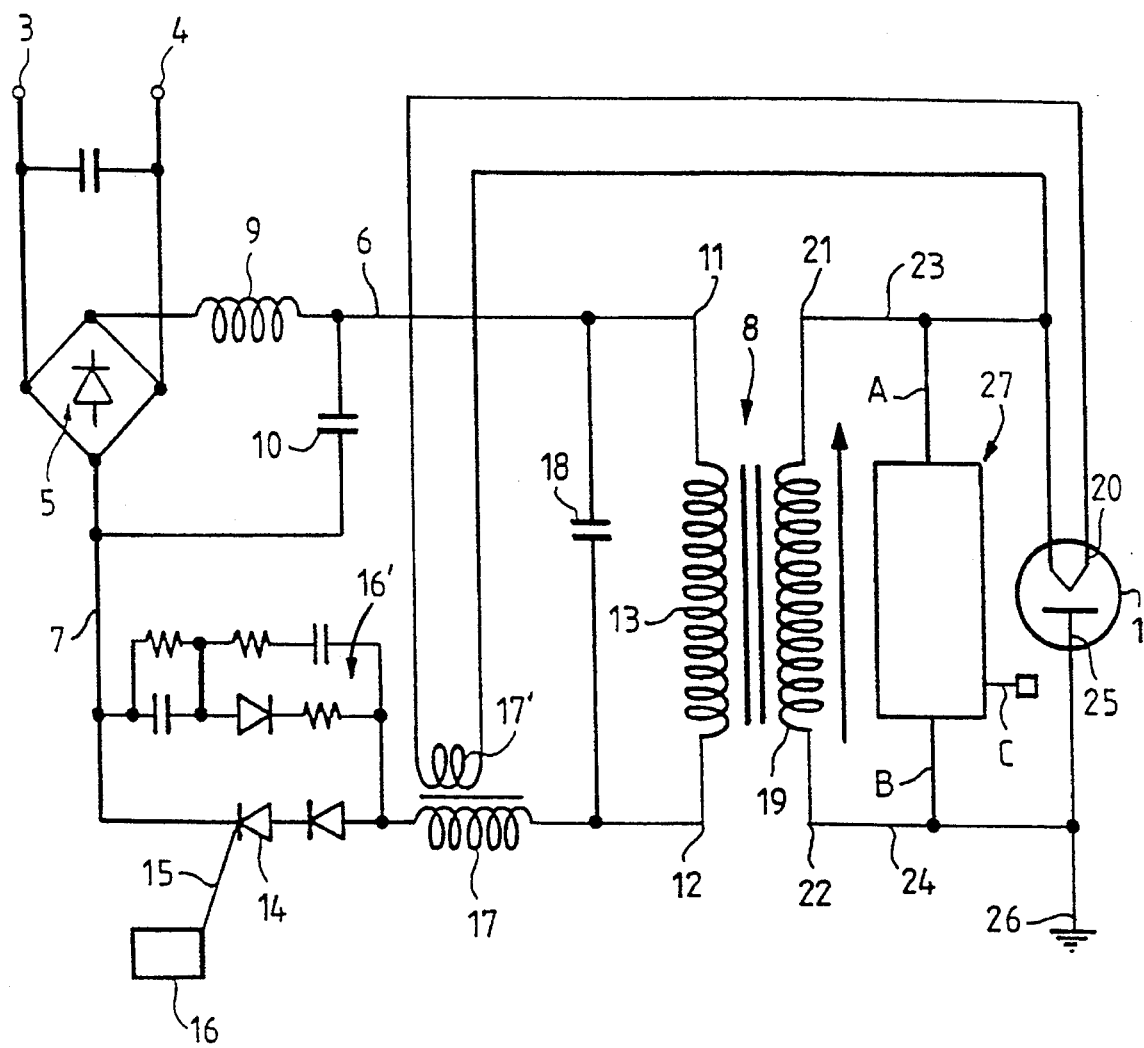
FIG. 1 shows an example of connecting up a device for malfunction detection, according to the invention, positioned in a magnetron supply circuit.

In the example embodiment described in FIG. 1, the circuit is intended more especially for powering a magnetron 1 of a microwave oven from an alternating mains supply arriving at the terminals 3 and 4 of the circuit. These terminals 3 and 4 are connected to a rectifier 5 which is formed by a full-wave diode bridge whose output is connected to two supply lines 6 and 7 of a high-voltage transformer 8. The rectifier 5 has at the output an antiparasitic filter composed of a coil 9 and a capacitor 10. The lines 6 and 7 are connected respectively to the ends 11 and 12 of the primary winding 13 of the transformer 8. The line 7 also includes a switching element 14 having a gate 15 connected to a control circuit 16. The switching element 14 consists of a unidirectional current switch. The circuit also includes a capacitor 18 connected in parallel to the winding 13, and a self inductor 17 mounted in series with the assembly constituted by the capacitor 18 and the primary winding 13. The self inductor 17 is coupled to a secondary winding 17' whose ends are connected to the heating element 20 of the magnetron 1.

The secondary winding 19 of the transformer 8 has respectively two terminals 21 and 22 connected respectively to two supply lines 23 and 24, one 23 connected to the cathode 20 of the magnetron 1 and the other 24, to the anode 25 of the magnetron, which is also connected to earth 26.

The device 27 for detecting malfunctioning of the magnetron is connected, for example, in parallel to the terminals of the secondary winding 19 on the supply lines 23 and 24 by supply lines A and B. This detection device 27 has an output line C sending a detection signal which will be processed by an error-correction stage (not shown) controlling means for regulating the magnetron supply.

Figure 2:
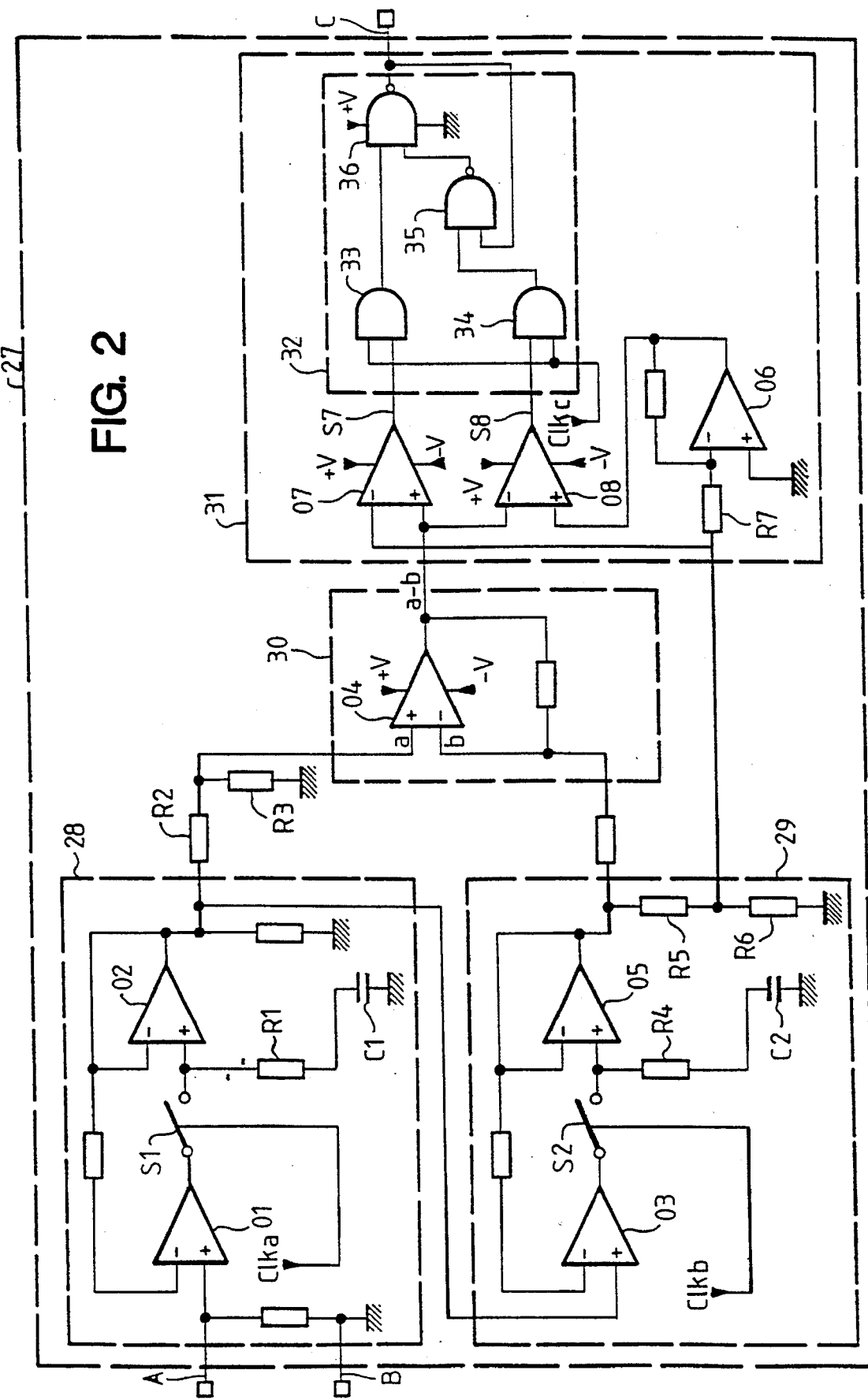
FIG. 2 shows a circuit of a device for detecting the malfunctioning of a unidirectional load, suitable for mounting in the circuit of FIG. 1.

According to FIG. 2, the device 27 for detecting malfunctioning of the magnetron has a means 28 for measuring the voltage value at the terminals 21 and 22 of the secondary winding of the high-voltage transformer 8 at a specific instant, the measured value being the peak value of the voltage, a means 29 for storing the said peak voltage value at various successive instants, a means 30 for comparing two successive values providing, in the event of a difference in value, an excess signal, and a means 31 for detecting the appearance of malfunctioning of the said load analyzing the said excess signal.

The supply line A is connected to the non-inverting input of an operational amplifier 01 contained in a first LF 398 integrated circuit from THOMSON. The output of this operational amplifier is connected to the input of a switching device $S_1$ also contained in the first integrated circuit. The switching device $S_1$ is controlled by a clock clk a triggering the initiation of the measurement of peak voltage $V_{C2}$ at a specific instant on a rising level of the voltage generated by a voltage oscillator. The output of this switching device $S_1$ is connected, on the one hand, to the non-inverting input of an operational amplifier O2 forming an integral part of the LF 398 integrated circuit, and, on the other hand, to a capacitor $C_1$ mounted in series with a resistor $R_1$, enabling it to be charged to the value $V_{C2}$ when the switching device $S_1$ is closed and to be discharged from the said value when the switching device $S_1$ is open. The output of the operational amplifier O2 is connected, on the one hand, to the non-inverting input of an operational amplifier O3 of a second LF 398 integrated circuit and, on the other hand, to a voltage divider $R_2$, $R_3$ whose junction is connected to the non-inverting input of an operational amplifier O4 of a SIEMENS LM 101 integrated circuit.

The output of this operational amplifier O3 is connected to the input of a switching device $S_2$ contained in the second integrated circuit. The switching device $S_2$ is controlled by a clock clk b operating in the same way as the clock clk a but triggered at different time intervals. The output of the switching device $S_2$ is connected, on the one hand, to the non-inverting input of an operational amplifier O5 of the second LF 398 integrated circuit and, on the other hand, to a capacitor $C_2$ mounted in series with a resistor $R_4$, enabling storage of the value of the voltage $V_{C2}$ contained in the capacitor $C_1$ when the switching device $S_2$ is closed and the switching device $S_1$ open. The output of the operational amplifier O5 is connected, on the one hand, to the inverting input of the operational amplifier O4, and, on the other hand, to one end of a voltage divider $R_5$, $R_6$ determining a threshold value of the operating voltage of the magnetron, the other end of the voltage divider $R_5$, $R_6$ being connected to the negative voltage terminal. The junction of the resistors $R_5$ and $R_6$ is connected, on the one hand, through another resistor $R_7$ to the inverting input of an operational amplifier O6 of a Siemens TCA 965 window comparator and, on the other hand, to the inverting input of an operational amplifier $O_7$. The operational amplifier O4 measures the difference between the value a of the peak voltage $V_{C2}$ measured at time t and the value b of the previous $V_{C2}$ peak voltage at time t-1, the signal corresponding to this difference a–b is sent to the non-inverting input of the operational amplifier O7 of the window comparator and to the inverting input of an operational amplifier O8 of the same window comparator. The outputs S7 and S8 of these operational amplifiers O7 and O8 are connected respectively to a logic gate device 32 comprising at least two AND gates 33 and 34, one of whose inputs is connected to a clock clk c operating in the same way as the clock clk a but lagging after each $V_{C2}$ voltage pulse, and inverting AND gates 35 and 36. The output signal C of the logic gate device 32 enables, by engaging a counting means (not shown), exact definition of the frequency of repetition of the malfunctioning. The output of the counting means determining the frequency of repetition of the malfunctioning is sent to one of the inputs of a comparison means (not shown), the other input being connected to a component (not shown) giving a threshold frequency value. According to the difference between the value of the frequency of repetition of the malfunctioning and the threshold frequency value, an output signal from the comparison means acts on the magnetron supply either by disabling it or by varying the oven start-up power supply setting $P_0$, the supply disabling and variation of power setting $P_0$ being controlled by an error-correction stage.

FIG. 3a shows the peak voltage which appears at the secondary-winding terminals and which is measured in order to detect the malfunctioning of the magnetron.

FIG. 3b shows the cycle of the clock clk a triggering the activation of the switching device for the means for measuring the $V_{C2}$ peak value.

FIG. 3c shows the cycle of the clock clk b triggering the activation of the switching device for the means for storing the $V_{C2}$ peak value measured by the measurement means.

FIG. 3d shows the measured voltage a applied to the non-inverting input of the operational amplifier O4.

FIG. 3e shows the stored voltage b applied to the inverting input of the operational amplifier O4.

FIG. 3f shows the voltage difference (a–b) between the peak value of the voltage $V_{C2}$ measured at time t and that measured at time t-1.

FIG. 3g shows the cycle of the clock clk c triggering the activation of the logic AND gate device in order to obtain a signal for the counting means enabling the frequency of repetition of magnetron malfunctioning to be defined.

FIG. 3h shows one magnetron malfunction detection signal.

According to FIG. 3a, peak values $V_{C2}$ of successive voltages are detected at the secondary-winding terminals of the transformer. Each voltage value $V_{C2}$ is measured by the measurement means 28 at the time of closure of the switching device $S_1$ activated by the clock clk a as shown on FIG. 3b. The measurement of the voltage $V_{C2}$ is stored by the storage means 29 at the time of opening of the switching device $S_1$ of the measurement means 28, and closure of the switching device S2 of the storage means 29 (clk b activation). The clocks clk a and clk b have the same period but are out of phase, the phase difference of the clock clk a with respect to the clock clk b corresponding to a half-period.

At the time of the first $V_{C2}$ voltage measurement at time t, the voltage value being approximately equal to a normal $V_{C2}$ operating voltage of the magnetron, no signal appears at the inputs a and b (FIG. 3d and FIG. 3e) of the operational amplifier O4. At the time of the second $V_{C2}$ voltage measurement at time t+1, the peak value of voltage $V_{C2}$ being greater than the normal $V_{C2}$ magnetron operating voltage, a signal a 1, (FIG. 3d) appears at the non-inverting input of the operational amplifier O4. The clock clk b being triggered with a phase difference of a half-period, the signal $b_1$ (FIG. 3e) appears at the inverting input of the operational amplifier. The latter, measuring the voltage difference, produces a signal (a–b) at its output with a positive pulse $P_1$, for a half-period between activation of the clock clk a and activation of the clock clk b, a null pulse $P_2$ for a half-period between activation of the clock clk b and a further activation of the clock clk a, and a negative pulse $P_3$ for a half-period between activation of the clock clk a and activation of the clock clk b. The positive pulse $P_1$ corresponds to the variation of the peak $V_{C2}$ voltage value between a normal peak voltage value at time t, for example, $V_{C2}$ approximately equal to 4000 V and an abnormal peak $V_{C2}$ voltage value at time t+1 approximately equal to 4800 V. The negative pulse $P_3$ corresponds to the variation of the peak $V_{C2}$ voltage value between the abnormal peak $V_{C2}$ voltage value at time t+1 and the normal peak $V_{C2}$ voltage value at time t+2.

The pulses of the clock clk c (FIG. 3g) are out of phase with respect to the pulses of the clocks clk a and clk b. The pulses of the clock clk c are triggered at the end of each $V_{C2}$ signal appearing at the secondary winding terminals, shown in FIG. 3a, in order to analyze the signal a–b (FIG. 3f). On the output C of the logic-gate device 32 (FIG. 3h) showing the signal for detecting the malfunctioning of the load, in this case the magnetron, a positive pulse $P_4$ is obtained as soon as a positive pulse $P_1$ of voltage $V_{C2}$ variation is detected on the output of the amplifier O4.

From the period of this pulse, the frequency at which the malfunctioning of the load appears is determined. In fact, in our particular case, the pulse $P_4$ appears for a duration equal to the period of the clock clk c, the interruption of this pulse $P_4$ occurring during the appearance of the negative pulse $P_3$ on the output of the amplifier O4 indicating a significant variation of the peak $V_{C2}$ voltage value. The malfunctioning of the load being thus detected, counting the said frequency of appearance acts on the error-correction stage preventing any deterioration of the load, such as the magnetron, either by breaking the supply or by regulation of the start-up power setting $P_0$ of the said load.

Modifications of the invention herein disclosed will occur to a person skilled in the art and all such modifications are deemed to be within the scope of this invention as defined by the appended claims.

I claim:

1. Device for detecting the malfunctioning of a magnetron which operates at start-up with a high power setting $P_0$, and which is connected to the terminals (21, 22) of the secondary winding (19) of a high-voltage transformer (8), forming part of an electric supply circuit for said magnetron, said device comprising a means for measuring (28) peak voltage values sampled in said supply circuit, during operation of said magnetron said measurement means being connected to the secondary-winding terminals of the high-voltage transformer (8), a means for storing (29) said voltage values measured at successive instants, a means for comparing (30) two successive voltage values generating, in the event of a difference in value, an excess signal (a–b), and a means for detecting (31) the excess signal and for sending a malfunction signal to a counting means in order to determine the frequency of said malfunction.

2. Detection device according to claim 1, wherein said means for measuring (28) the peak voltage value at the secondary winding terminals of the high-voltage transformer comprises an operational amplifier $O_1$ whose non-inverting input is connected to the secondary-winding terminals of the transformer (8), a switching device $S_1$ triggered by a clock Clk a and connected to the output of the operational amplifier $O_1$, a capacitor $C_1$ connected between the output of the switching device $S_1$ and earth, and an operational amplifier $O_2$ whose non-inverting input is connected to the output of the switching device $S_1$.

3. Detection device according to claim 1, wherein said means for storing (29) the peak voltage value comprises an operational amplifier ($O_4$) whose non-inverting input is connected to the output of the operational amplifier $O_2$, a switching device $S_2$ activated by a clock clk b and connected to the output of the operational amplifier $O_3$, a capacitor $C_2$ mounted in series with a resistor $R_4$ between earth and the output of the switching device $S_2$, and an operational amplifier $O_5$ whose non-inverting input is connected to the output of the switching device $S_2$ and to the resistor $R_4$.

4. Detection device according to claim 3, wherein the comparison means (30) comprises an operational amplifier $O_4$ on which the inverting input is connected to the output of the operational amplifier $O_5$ and on which the non-inverting input is connected to a junction of a voltage divider ($R_2$, $R_3$) connected to the output of the operational amplifier $O_2$.

5. Detection device according to claim 4, wherein the detection means (31) comprises two operational amplifiers $O_7$ and $O_8$ whose two inverse-polarity inputs of $O_8$ are connected in common to the output signal (a–b) of the operational amplifier $O_4$, and whose other two inputs are connected respectively to a voltage divider ($R_5$, $R_6$) determining an operating threshold voltage value for the magnetron, and to the output of an operational amplifier $O_6$ whose inverting input is connected to said voltage divider ($R_5$, $R_6$), and a logic AND gate device (32) controlled by a clock clk c and enabling the malfunctioning to be detected.

6. Detection device according to claim 1, wherein said device is connected to the terminals of an additional secondary winding of the high-voltage transformer (8).

* * * * *